United States Patent
Chang et al.

(10) Patent No.: US 11,128,311 B1
(45) Date of Patent: Sep. 21, 2021

(54) ANALOG-TO-DIGITAL CONVERTING SYSTEM AND METHOD WITH OFFSET AND BIT-WEIGHTING CORRECTION MECHANISMS

(71) Applicant: ANPEC ELECTRONICS CORPORATION, Hsinchu (TW)

(72) Inventors: Ming-Hung Chang, Hsinchu County (TW); Jui-Chu Chung, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/016,574

(22) Filed: Sep. 10, 2020

(30) Foreign Application Priority Data

May 22, 2020 (TW) ................................. 109117216

(51) Int. Cl.
| | |
|---|---|
| *H03M 1/66* | (2006.01) |
| *H03M 1/12* | (2006.01) |
| *H03M 1/44* | (2006.01) |
| *H03M 1/26* | (2006.01) |
| *H03M 1/20* | (2006.01) |
| *H03M 1/06* | (2006.01) |
| *H03M 1/14* | (2006.01) |

(52) U.S. Cl.
CPC ....... *H03M 1/1245* (2013.01); *H03M 1/0607* (2013.01); *H03M 1/0658* (2013.01); *H03M 1/147* (2013.01); *H03M 1/204* (2013.01); *H03M 1/26* (2013.01); *H03M 1/442* (2013.01)

(58) Field of Classification Search
CPC ...... H03M 1/1245; H03M 1/204; H03M 1/26; H03M 1/442; H03M 1/0658; H03M 1/0607; H03M 1/147; H03M 1/12; H03M 1/00; H03M 1/14
USPC ........................................ 341/144, 155, 150
See application file for complete search history.

(56) References Cited

U.S. PATENT DOCUMENTS

| | | | | |
|---|---|---|---|---|
| 8,786,484 | B2* | 7/2014 | Cheong | H03M 1/12 |
| | | | | 341/172 |
| 8,907,826 | B2* | 12/2014 | Hong | H03M 1/12 |
| | | | | 341/118 |
| 9,590,592 | B2* | 3/2017 | Johal | H03H 19/004 |
| 9,831,889 | B1* | 11/2017 | Abu Hilal | H03M 1/1071 |
| 10,038,454 | B2* | 7/2018 | de Figueiredo | H03M 1/1245 |
| 2014/0168000 | A1* | 6/2014 | Lemkin | H03M 1/1245 |
| | | | | 341/172 |
| 2017/0012636 | A1* | 1/2017 | Venca | H03M 1/1245 |

* cited by examiner

*Primary Examiner* — Jean B Jeanglaude
(74) *Attorney, Agent, or Firm* — Li & Cai Intellectual Property (USA) Office

(57) ABSTRACT

An analog-to-digital converting system and a method with offset correction mechanisms are provided. The method includes steps of: obtaining a direct current offset of an output voltage of a digital analog conversion unit in a system; obtaining first capacitance weights and second capacitance weights sequentially from small to large; subtracting the direct current offset from a digital signal; and multiplying bit values of the digital signal respectively by the corresponding first capacitance weight value or second capacitance weight value to output a decode signal.

2 Claims, 8 Drawing Sheets

ANALOG-TO-DIGITAL CONVERTING SYSTEM AND METHOD WITH OFFSET AND BIT-WEIGHTING CORRECTION MECHANISMS

CROSS-REFERENCE TO RELATED PATENT APPLICATION

This application claims the benefit of priority to Taiwan Patent Application No. 109117216, filed on May 22, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an analog-to-digital converting system and a method thereof, and more particularly to an analog-to-digital converting system with offset and bit-weighting correction mechanisms and a method thereof.

BACKGROUND OF THE DISCLOSURE

With the rapid development of the information industry, an analog-to-digital converter (ADC) is widely used for voltage conversion. The analog-to-digital converter often includes a digital-to-analog conversion (DAC) unit having a multi-stage capacitor array structure. The digital-to-analog conversion unit having a typical two-stage capacitor array structure mainly includes m most significant bit (MSB) capacitors, n least significant bit (LSB) capacitors, and a bridge capacitor. A sum of capacitances of all of the n LSB capacitors is divided by a capacitance of the bridge capacitor to obtain an attenuation coefficient (z) that is larger than 1. An output voltage of the digital-to-analog conversion unit is amplified by z times for the MSB capacitors. Therefore, the capacitances required for the MSB capacitors can be divided by z times. It significantly saves chip area and cost.

However, layout routing and process variation create unexpected variations on each capacitor of the DAC, which degrades the linearity of the DAC and the performance of the ADC. An equivalent of the capacitances of the MSB capacitors are amplified by z times, which causes change in the MSB capacitors to be amplified by z times. Compared with the LSB capacitors, a small error in the capacitances of the MSB capacitors is sufficient to cause the output voltage of the digital-to-analog converter to occur a periodic non-linear offset such that an accuracy of voltage conversion of the analog-to-digital converter is reduced.

SUMMARY OF THE DISCLOSURE

In response to the above-referenced technical inadequacies, the present disclosure provides an analog-to-digital converting system with offset and bit weight correction mechanisms, which includes a capacitor circuit, a comparator, a switch circuit, a control circuit and a decode circuit.

The capacitor circuit includes a first capacitor group, a second capacitor group and a bridge capacitor. The first capacitor group is coupled with the second capacitor group through the bridge capacitor. The first capacitor group includes a plurality of first capacitors. The second capacitor group includes a plurality of second capacitors. An actual capacitance of each of the first capacitors is defined as a first capacitance weight. Each one of the first capacitance weights is not larger than a sum of the first capacitance weights each is smaller than the one first capacitance weight. A sum of all of the first capacitance weights is divided by an actual capacitance of the bridge capacitor to obtain an attenuation coefficient that is larger than 1. An actual capacitance of each of the second capacitors is multiplied by the attenuation coefficient to obtain a second capacitance weight. The second capacitance weight that is the smallest one among the second capacitor group is not larger than the sum of all of the first capacitance weights of the first capacitor group. Each one of the second capacitance weights is not larger than a sum of the smaller second capacitance weights each is smaller than the one second capacitance weight. All of capacitances of the capacitor circuit are designed to be an integer multiple of the capacitance that is the smallest one among the capacitances of the capacitor circuit. The capacitor circuit is called a digital-analog converter unit in an analog-digital converter system. A digital-analog converted voltage is at a node at which the second capacitor group is coupled with the bridge capacitor. The comparator has a first comparison input terminal connected to a node between the second capacitor group and the bridge capacitor. The comparator has a second comparison input terminal coupled to a third reference voltage. The comparator is configured to compare the third reference voltage with a converted voltage of the digital-analog converter to output a comparison signal. The switch circuit includes a plurality of first switch components, a plurality of second switch components, and a third switch component. The first switch components are connected to the first capacitors respectively. The second switch components are connected to the second capacitors respectively. Each of the first switch components and the second switch components are switched between an input signal, a first reference voltage and a second reference voltage. The first comparison input terminal of the comparator is coupled to the third reference voltage through the third switch component when the third switch is turned on. The control circuit is connected to the switch circuit and the comparator, and configured to output a digital signal according to the comparison signal and output a control signal for controlling the switch circuit. The decode circuit is connected to the control circuit and configured to decode the digital signal to output a decode signal having one or more bit values.

In certain embodiments, the analog-to-digital converting system further includes a storage circuit configured to record a correction parameter of an input offset of the comparator, a direct current offset of the digital-analog converter, the first capacitance weights and the second capacitance weights.

In addition, the present disclosure provides an analog-to-digital conversion method with offset and bit weight correction mechanisms for the analog-to-digital converting system. The analog-to-digital conversion method includes the following steps: converting a direct current offset of the digital-analog converter into the digital signal multiple times based on each of the first capacitance weights in the first capacitor group, averaging the plurality of digital signals to obtain a final digital value that represents the direct current offset voltage of the digital-analog converter, wherein the final digital value is a positive or negative value; converting the second capacitance weight that is the smallest one among the second capacitor group into the digital signal multiple times based on each of the first capacitance weights in the first capacitor group, averaging the plurality of digital signals to obtain a first averaged digital signal, subtracting the direct current offset digital value of the digital-analog converter from the first averaged digital signal to obtain a final digital value that represents the second capacitance weight that is the smallest second capacitance weight; converting the second capacitance weight that is the second smallest one among the second capacitor group into the digital signal multiple times based on the final smallest second capacitance weight and each of the first capacitance weights in the first capacitor group, averaging the plurality of digital signals to obtain a second averaged digital signal, subtracting the direct current offset digital value of the digital-analog convertor converter from the second averaged digital signal to obtain a final digital value that represents the second capacitance weight that is the second-smallest second capacitance weight; converting the second capacitance weight that is the third smallest one among the second capacitor group into the digital signal multiple times based on the final second-smallest second capacitance weight, the final smallest second capacitance weight and each of the first capacitance weights in the first capacitor group, averaging the plurality of digital signals to obtain a third averaged digital signal, subtracting the direct current offset digital value of the digital-analog converter from the third averaged digital signal to obtain a final digital value that represents the third-smallest second capacitance weight; sequentially obtaining final second capacitance weights of others of the second capacitors in the similar manner.

In certain embodiments, the analog-to-digital conversion method further includes the following step: correcting the comparator to reduce an offset of the comparator, obtaining a correction parameter of the comparator.

In certain embodiments, the analog-to-digital conversion method further includes the following step: using a storage circuit to record the correction parameter of the comparator, the digital value of the digital-analog converter, the first capacitance weights of the first capacitors, and the final second capacitance weights of the second capacitors.

In addition, the present disclosure provides an analog-to-digital conversion method with offset and bit weight correction mechanisms for the analog-to-digital converting system. The analog-to-digital conversion method includes the following steps: inputting an analog signal and converting the analog signal into the digital signal; subtracting the direct current offset digital value of the digital-analog converter from the digital signal to obtain a final input signal digital value; multiplying each of bit values of the final input signal digital value by a weight of each of the bit values to obtain a product value, and decoding a sum of the product values into a binary digital value having one or more bit values.

In certain embodiments, the first capacitance weight that is the smallest one among the first capacitor group corresponds to a bit weight that is the smallest one among digital values. The first capacitance weight that is the second smallest one among the first capacitor group corresponds to a bit weight that is the second smallest one among the digital values. The second capacitance weight that is the largest one among the second capacitor weight corresponds to a bit weight that is the largest one among digital values.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
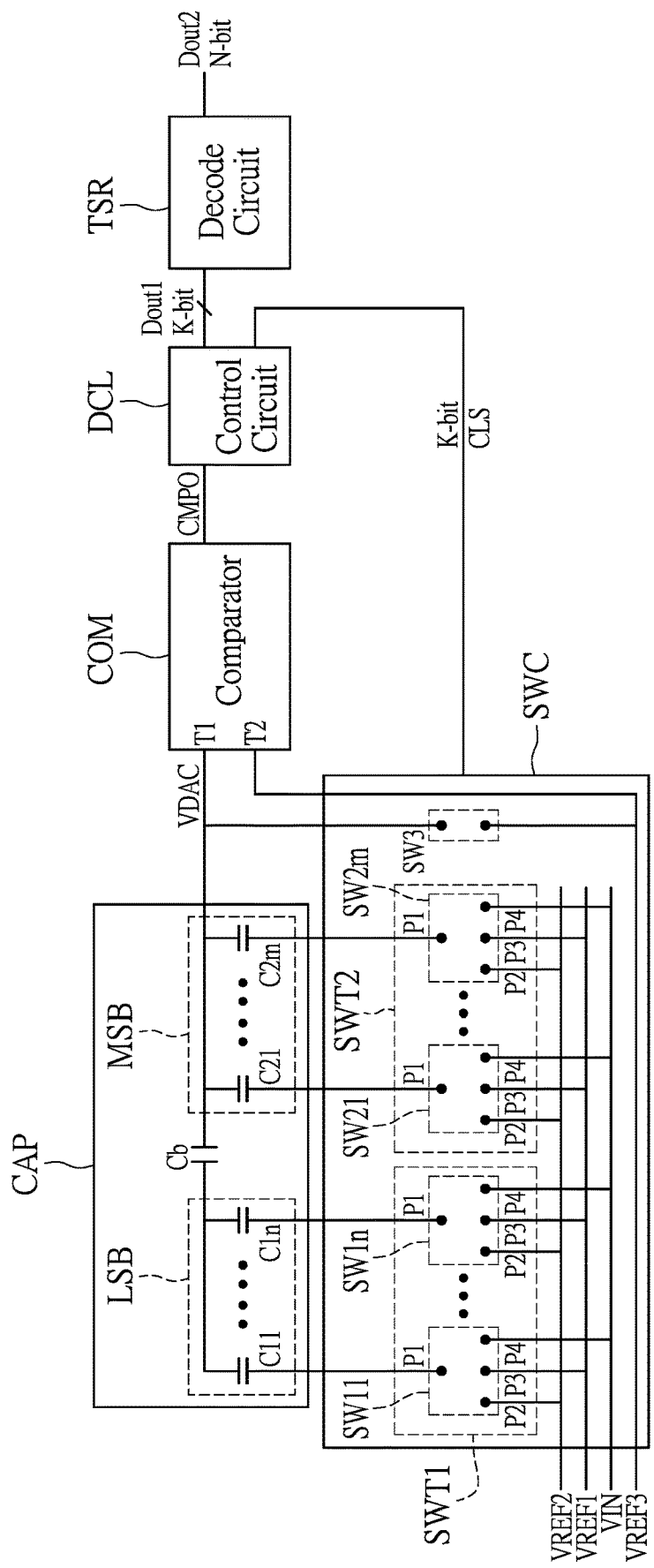
FIG. 1 is a circuit functional block diagram of an analog-to-digital converting system with offset and bit weight correction mechanisms according to an embodiment.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit functional block diagram of an analog-to-digital converting system with offset and bit weight correction mechanisms according to an embodiment.

As shown in FIG. 1, in the embodiment, the analog-to-digital converting system with offset and bit weight correction mechanisms may include a capacitor circuit CAP, a switch circuit SWC, a comparator COM, a control circuit DCL and a decode circuit TSR. The capacitor circuit CAP is connected to the switch circuit SWC. The comparator COM is connected to the capacitor circuit CAP and the switch circuit SWC. The control circuit DCL is connected to the comparator COM and the decode circuit TSR.

The capacitor circuit CAP includes a first capacitor group LSB, a second capacitor group MSB and a bridge capacitor Cb. The bridge capacitor Cb is connected between the first capacitor group LSB and the second capacitor group MSB. The first capacitor group LSB includes a plurality of first capacitors C11 to C1$n$, wherein n represents the number of first capacitors and may be any suitable integer value. The second capacitor group MSB includes a plurality of second capacitors C21 to C2$m$, wherein m represents the number of second capacitors and may be any suitable integer value. The capacitor circuit CAP is called a digital-analog converter unit. A digital-analog converted voltage is at a node at which the second capacitor group MSB is coupled with the bridge capacitor Cb.

For convenience of description, in this embodiment, the larger a reference number of each of the first capacitors C11 to C1$n$ is, the larger a capacitance of each of the first capacitors C11 to C1$n$ is. For example, the capacitance of the first capacitor C13 is larger than or equal to the capacitance of each of the first capacitors C11 to C12, the capacitance of the first capacitor C19 is larger than or equal to the capacitance of each of the first capacitors C11 to C18, and so on.

Similarly, the larger a reference number of each of the second capacitors C21 to C2$n$ is, the larger a capacitance of each of the second capacitors C21 to C2$n$ is. For example, the capacitance of the second capacitor C26 is larger than or equal to the capacitance of each of the second capacitors C21 to C25, the capacitance of the second capacitor C23 is larger than or equal to the capacitance of each of the second capacitors C21 to C22, and so on.

It is worth noting that, the capacitance of each of the first capacitors C11 to C1$n$ is not larger than a sum of the smaller and the smallest capacitances among the capacitances of the first capacitors C11 to C1$n$ of the first capacitor group LSB, which is represented by the following equation:

$$C1x <= (\Sigma_{i=1}^{x-1} C1i) + Cunit1,$$

wherein x is a value falling within a range of 2 to n, 2 is a minimum value of x, n is a maximum value of x, Cunit1 represents a unit capacitance that is the smallest one among the capacitances of the first capacitors C11 to C1$n$ such as the capacitance of the first capacitor C11.

For example, the capacitance of the first capacitor C13 is smaller than or equal to a sum of the capacitances of the first capacitors C11 and C12 and the capacitance of the first capacitor C11 that is the smallest one among the capacitances of the first capacitor C11 to C13. For example, the capacitance of the first capacitor C16 is smaller than or equal to a sum of the capacitances of the first capacitors C11 to C15 and the capacitance of the first capacitor C11 that is the smallest one among the capacitances of the first capacitor C11 to C16.

The capacitance of the second capacitor C21 to C2$m$ is not larger than a sum of the smaller and the smallest capacitances among the capacitances of the second capacitor C21 to C2$m$, which is represented by the following equation:

$$C2y <= (\Sigma_{j=1}^{y-1} C2j) + Cunit2,$$

wherein y is a value falling within a range of 2 to m, 2 is a minimum value of y, m is a maximum value of y, Cunit2 represents a unit capacitance that is the smallest one among the capacitances of the second capacitor C21 to C2$m$ such as the capacitance of the second capacitor C21.

An actual capacitance of each of the first capacitors C11 to C1$n$ is defined as a first capacitance weight. Each of the first capacitance weights is not larger than a sum of the smaller first capacitance weights. A sum of all of the first capacitance weights is divided by a capacitance of the bridge capacitor Cb to obtain an attenuation coefficient that is larger than 1, which is calculated by the following equation:

$$Z = \frac{\sum_{k=1}^{n} C1k}{CB},$$

wherein Z represents the attenuation coefficient, n represents the number of and the reference number of the first capacitors C11 to C1$n$, $(\Sigma_{k=1}^{n} C1k)$ represents a sum of the capacitances of all of the first capacitors C11 to C1$n$ of the first capacitor group LSB, and CB represents the capacitance of the bridge capacitor Cb.

The capacitance of each of the second capacitors C21 to C2$m$ is multiplied by the attenuation coefficient to obtain a second capacitance weight. The second capacitance weight that is the smallest one among the second capacitance weights of all of the second capacitors C21 to C2$m$ of the second capacitor group MSB is not larger than a sum of the first capacitance weights of all of the first capacitors C11 to C1$n$ of the first capacitor group LSB. Each of the second capacitance weights is not larger than a sum of the smaller second capacitance weights. Each of the capacitances of the capacitor circuit CAP is an integer multiple of the capacitance that is the smallest one among the capacitances of the capacitor circuit CAP. This is represented by the following equation:

$$Z \times C21 \le \left( \sum_{k=1}^{n} C1k \right) + Cunit1,$$

wherein Z represents the attenuation coefficient, n represents the number of and the reference number of the first capacitors C11 to C1n, ($\sum_{k=1}^{n}$ C1k) represents the sum of the capacitances of all of the first capacitors C11 to C1n of the first capacitor group LSB, and Cunit1 represents the capacitance that is the smallest one among the capacitances of the first capacitors C11 to C1n such as the capacitance of the first capacitor C11.

In an ideal design, a weight sum is equal to an equivalent capacitance sum, which is represented by the following equation: Ctotal=$\sum_{k=1}^{n}$ C1k+Zx [$\sum_{j=1}^{m}$ C2j]. Variation of process parameters of an integrated circuit and a parasitic capacitance in a layout of the integrated circuit cause that each of the capacitances does not meet expectations. As a result, an attenuation coefficient (z) and the second capacitance weights of the second capacitor are very different from the expected values such that a large error occurs in the analog-to-digital conversion.

In the embodiment, the capacitance of each of the first capacitors C11 to C1n may be an integer multiple of the unit capacitance such as the capacitance of the first capacitor C11 that is the smallest one among the capacitances of the first capacitors C11 to C1n. Similarly, the capacitance of each of the second capacitors C21 to C2m may be an integer multiple of the unit capacitance such as the capacitance of the second capacitor C21 that is the smallest one among the capacitances of the second capacitors C21 to C2m. Therefore, a better layout matching effect can be achieved.

For example, the capacitance of the first capacitor C12 is twice the capacitance of the first capacitor C11, the capacitance of the first capacitor C13 is four times the capacitance of the first capacitor C11, the capacitance of the first capacitor C14 is seven times the capacitance of the first capacitor C11, but the present disclosure is not limited thereto.

The switch circuit SWC includes a first switch group SWT1, a second switch group SWT2 and a third switch component SW3. The first switch group SWT1 includes a plurality of first switch components SW11 to SW1n, wherein n represents the number of first switch components and may be any suitable integer value. The second switch group SWT2 includes a plurality of second switch components SW21 to SW2m, wherein m represents the number of second switch components and may be any suitable integer value.

Each of the first switch components SW11 to SW1n and the second switch components SW21 to SW2m may have a first switching point P1, a second switching point P2, a third switching point P3 and a fourth switching point P4. The second switching point P2 is coupled to a second reference voltage VREF2. The third switching point P3 is coupled to a first reference voltage VREF1. The fourth switching point P4 is coupled to an input signal source and receives an input signal VIN having an analog voltage from the input signal source. The first switching point P1 may be connected to the second switching point P2, the third switching point P3 or the fourth switching point P4.

The first switching points P1 of the first switch components SW11 to SW1n of the switch circuit SWC are respectively connected to first terminals of the first capacitors C11 to C1n of the first capacitor group LSB. Second terminals of the first capacitors C11 to C1n are connected to a first terminal of the bridge capacitor Cb.

The first switching points P1 of the second switch components SW21 to SW2m of the switch circuit SWC are respectively connected to first terminals of the second capacitors C21 to C2m of the second capacitor group MSB. Second terminals of the second capacitors C21 to C2m are connected to a second terminal of the bridge capacitor Cb.

The control circuit DCL may control the switch circuit SWC. For example, the control circuit DCL switches each of the first switch components SW11 to SW1n and the second switch components SW21 to SW2m between the input signal VIN, the first reference voltage VREF1 and the second reference voltage VREF2.

In detail, when the control circuit DCL controls the first switch components SW11 to SW1n such that the first switching points P1 of the first switch components SW11 to SW1n are respectively connected to the fourth switching points P4, the first capacitors C11 to C1n are coupled to the input signal VIN respectively through the first switch components SW11 to SW1n. Similarly, when the control circuit DCL controls the second switch components SW21 to SW2m such that the first switching points P1 of the second switch components SW21 to SW2m are respectively connected to the fourth switching points P4, the second capacitors C21 to C2n are coupled to the input signal VIN respectively through the second switch components SW21 to SW2m.

When the control circuit DCL controls the first switch components SW11 to SW1n such that the first switching points P1 of the first switch components SW11 to SW1n are respectively connected to the second switching points P2, the first capacitors C11 to C1n are coupled to the second reference voltage VREF2 respectively through the first switch components SW11 to SW1n. Similarly, when the control circuit DCL controls the second switch components SW21 to SW2m such that the first switching points P1 of the second switch components SW21 to SW2m are respectively connected to the second switching points P2, the second capacitors C21 to C2n are coupled to the second reference voltage VREF2 respectively through the second switch components SW21 to SW2m. The second reference voltage VREF2 may be at a high voltage level and is an upper limit voltage into which the input signal VIN can be converted. When the input signal VIN is higher than the second reference voltage VREF2, a digital signal Dout1 cannot be correctly generated.

When the control circuit DCL controls the first switch components SW11 to SW1n such that the first switching points P1 of the first switch components SW11 to SW1n are respectively connected to the third switching points P3, the first capacitors C11 to C1n are coupled to the first reference voltage VREF1 respectively through the first switch components SW11 to SW1n. Similarly, when the control circuit DCL controls the second switch components SW21 to SW2m such that the first switching points P1 of the second switch components SW21 to SW2m are respectively connected to the third switching points P3, the second capacitors C21 to C2n are coupled to the first reference voltage VREF1 respectively through the second switch components SW21 to SW2m. The first reference voltage VREF1 may be at a low voltage level and is a lower limit voltage into which the input signal VIN can be converted. When the input signal VIN is lower than the first reference voltage VREF1, the digital signal Dout1 cannot be correctly generated.

The comparator COM has a first comparison input terminal T1 and a second comparison input terminal T2. One of the first comparison input terminal T1 and the second comparison input terminal T2 is an inverting input terminal and another of them is a non-inverting input terminal. The first comparison input terminal T1 of the comparator COM is connected to a node between the second capacitor group MSB and the bridge capacitor Cb. A voltage of the node is defined as a conversion voltage VDAC.

When the control circuit DCL turns on the third switch component SW3, the first comparison input terminal T1 of the comparator COM is coupled to a third reference voltage VREF3 such that the conversion voltage VDAC is reset to be equal to the third reference voltage VREF3. In addition, the second comparison input terminal T2 of the comparator COM is directly coupled to the third reference voltage VREF3.

When each of the first switch components SW11 to SW1$n$ and the second switch components SW21 to SW2$m$ is switched, the first comparison input terminal T1 of the comparator COM reacquires the conversion voltage VDAC of the node between the second capacitor group MSB and the bridge capacitor Cb. Then, the comparator COM compares the conversion voltage VDAC with the third reference voltage VREF3 to output a comparison signal CMPO to the control circuit DCL.

That is, the number of times that the comparator COM compares the conversion voltage VDAC with the third reference voltage VREF3 and the number of bit values or logical values of the comparison signal CMPO may depend on the number of first switch components SW11 to SW1$n$ and the second switch components SW21 to SW2$m$, and the number of times that the first switch components SW11 to SW1$n$ and the second switch components SW21 to SW2$m$ are switched.

Each time the switch circuit SWC is switched, the control circuit DCL outputs a control signal CLS to the switch circuit SWC according to the bit value or the logical value of the comparison signal CMPO. The first switch components SW11 to SW1$n$ and the second switch components SW21 to SW2$m$ are controlled by the control signal CLS.

After all of the first switch components SW11 to SW1$n$ and the second switch components SW21 to SW2$m$ of the switch circuit SWC are switched, the switch circuit SWC is switched multiple times, and the bit values or the logical values of the comparison signal CMPO are generated. Then, the control circuit DCL outputs the digital signal Dout1 according to the bit values or the logical values of the comparison signal CMPO. The number of bits of the digital signal Dout1 is represented by K, which is calculated by the following equation:

$$K=(n+m)>=N,$$

wherein K represents the number of bits of the digital signal Dout1, n represents the number of first capacitors C11 to C1$n$ or the first switch components SW11 to SW1$n$, m represents the number of second capacitors C21 to C2$m$ or the second switch components SW21 to SW2$m$, N represents the number of bits of a decode signal Dout2 described in detail as follows.

Finally, the decode circuit TSR may receive the digital signal Dout1 having K bits from the control circuit DCL and decode the digital signal Dout1 into the decode signal Dout2 having N bits, wherein N is any suitable integer value. A base of bit values of the decode signal Dout2 may be different from a base of bit values of the digital signal Dout1. For example, the base of the decode signal Dout2 is 2 and has binary bit values, but the present disclosure is not limited thereto.

Figure 2:
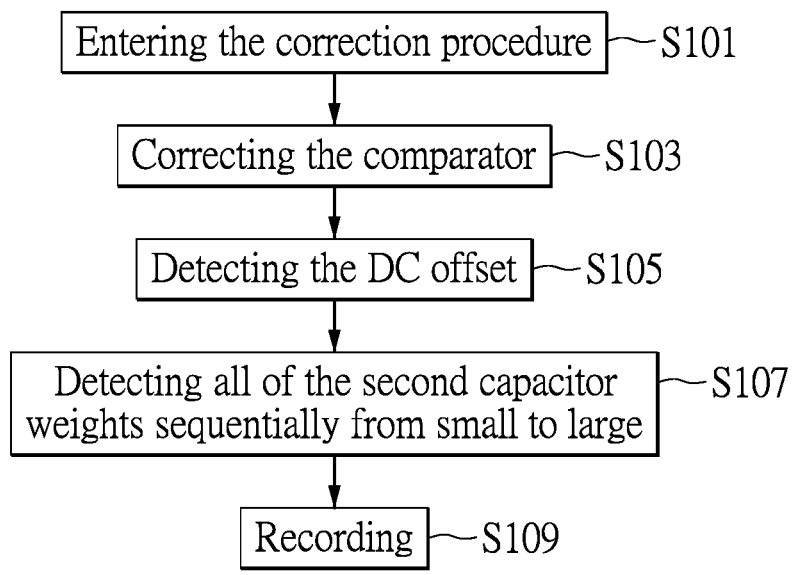
FIG. 2 is a flowchart diagram of correction steps of an analog-to-digital conversion method with offset and bit weight correction mechanisms according to the embodiment.

Reference is made to FIGS. 1, 2, 4 to 7, wherein FIG. 2 is a flowchart diagram of correction steps of an analog-to-digital conversion method with offset and bit weight correction mechanisms according to the embodiment. As shown in FIG. 2, in the embodiment, the analog-to-digital conversion method may include the following steps S101 to S109, which is applicable to the analog-to-digital converting system as shown in FIG. 1. It should be understood that, an order and processes of the steps S101 to S109 may be adjusted according to actual requirements.

In step S101, correction processes of the analog-to-digital conversion method starts to be performed.

In step S103, an input offset of the comparator COM is corrected and a correction parameter of the comparator COM is obtained.

In step S105, a direct current (DC) offset of the conversion voltage VDAC is obtained.

In step S107, the second capacitor weights are sequentially obtained from small to large.

In step S109, the DC offset of step S105 and the second capacitor weights of S107 are recorded.

Figure 4:
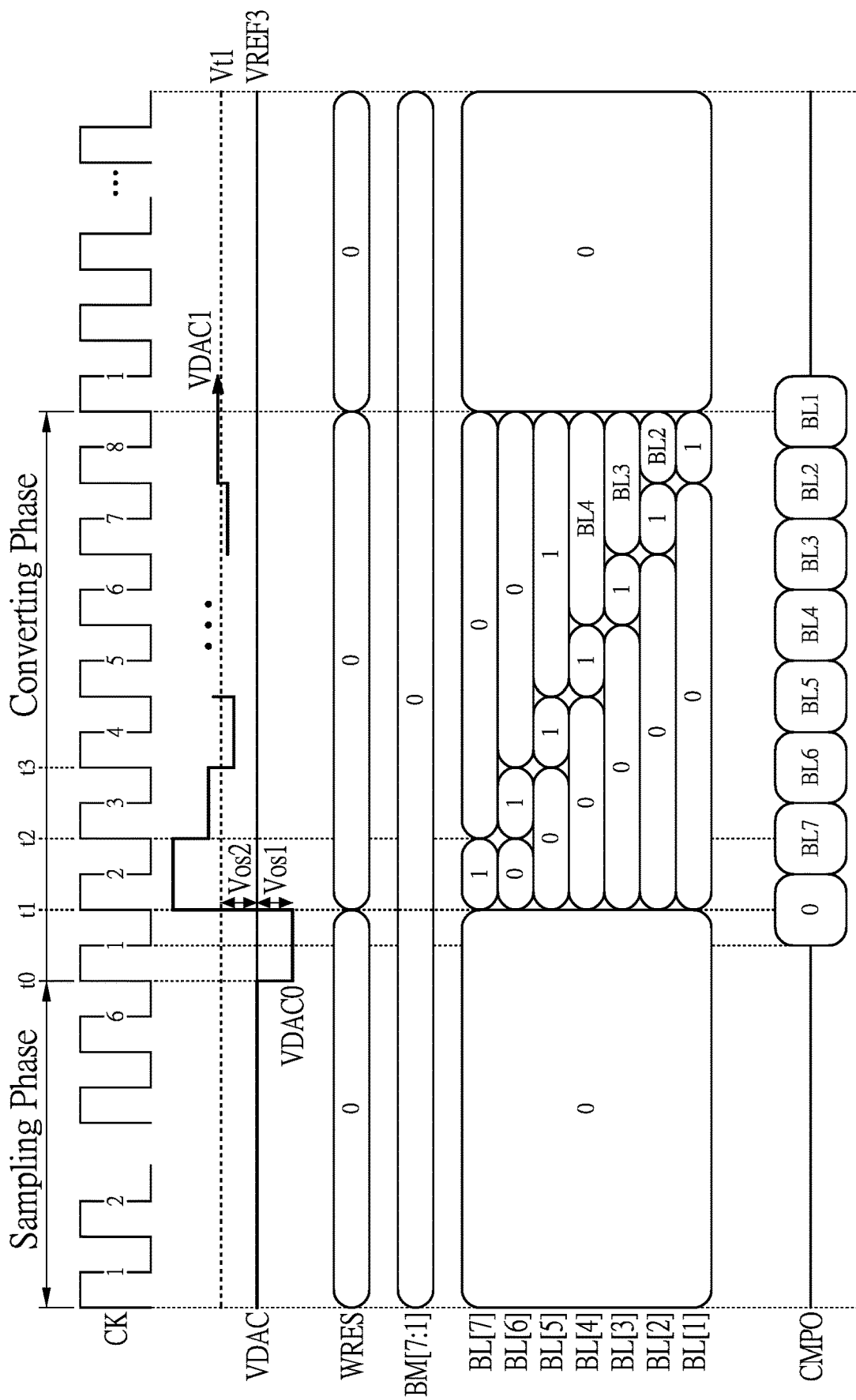
FIG. 4 is a waveform diagram of signals generated when the analog-to-digital conversing system and method with the offset and bit weight correction mechanisms switch a plurality of first capacitors to different voltage levels for a negative offset of a voltage VDAC at a DC voltage level according to the embodiment.
Figure 5:
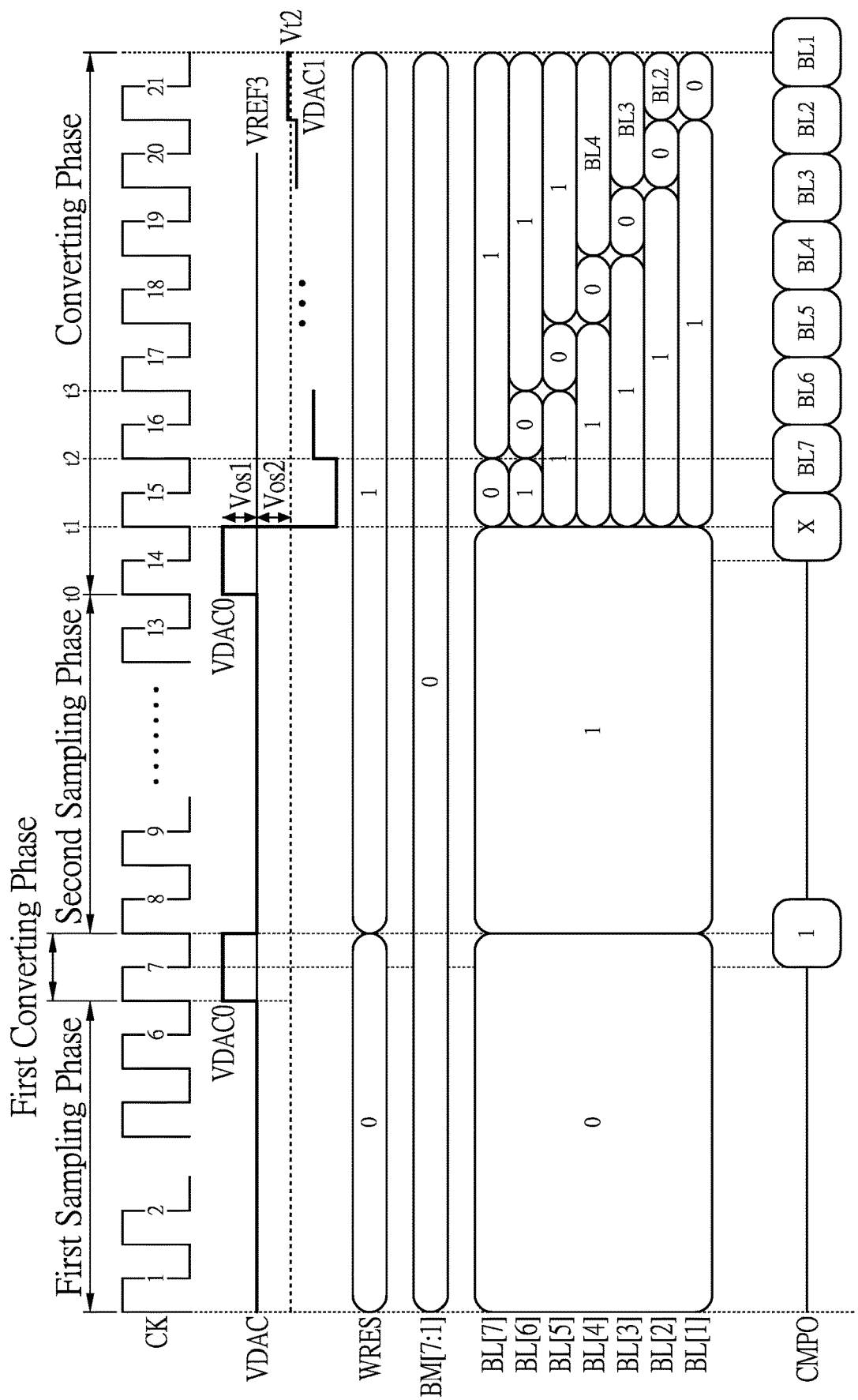
FIG. 5 is a waveform diagram of signals generated when the analog-to-digital conversing system and method with the offset and bit weight correction mechanisms couple the plurality of first capacitors to different voltage levels for a positive offset of a voltage VDAC at a DC voltage level according to the embodiment.

In the embodiment of FIGS. 4 and 5, the number of the first switch components SW11 to SW17 is the same as the number of the second switch components SW21 to SW27. That is, n of SW1$n$ is equal to m of SW2$m$, which is represented by n=m. First switch level signals BL[7] to BL[1] can be represented by BL[7:1] and respectively indicate voltage levels to which the first switch components SW17 to SW11 are coupled. Second switch level signals BM[7] to BM[1] can be represented by BM[7:1] and respectively indicate voltage levels to which the second switch components SW27 to SW21 are coupled. If any one of the first switch components SW11 to SW17 and the second switch components SW21 to SW27 is coupled to the first reference voltage VREF1, the voltage level is 0. If any one of the first switch components SW11 to SW17 and the second switch components SW21 to SW27 is coupled to the second reference voltage VREF2, the voltage level is 1.

First, as shown in FIG. 4, in step S105, all of the first switch components SW11 to SW17 and the second components SW21 to SW27 are coupled to the first reference voltage VREF1 at a low voltage level, which are respectively represented by BM[7:1]=0000000, BL[1]=0, BL[2]=0, BL[3]=0, BL[4]=0, BL[5]=0, BL[6]=0, BL[7]=0, during a sampling phase.

In addition, the third switch component SW3 shown in FIG. 1 is turned on such that the first comparison input terminal T1 of the comparator COM is coupled to the third reference voltage VREF3 and the conversion voltage VDAC is equal to the third reference voltage VREF3, during the sampling phase as shown in FIG. 4.

Then, the third switch component SW3 is turned off such that the first comparison input terminal T1 of the comparator COM is decoupled from the third reference voltage VREF3, during a converting phase as shown in FIG. 4. As a result, the conversion voltage VDAC is floating and changes with changing in switching states of the first switch components SW11 to SW17.

Then, the control circuit DCL sequentially switches the first switch components SW17 to SW11 to the second reference voltage VREF2 at a high voltage level from the first reference voltage VREF1 at a low voltage level, during the converting phase.

Each time the switch circuit SWC is switched, the comparator COM compares the conversion voltage VDAC with the third reference voltage VREF3 to output the comparison signal CMPO. When the first switch components SW17 to SW11 are sequentially switched, the comparator COM sequentially outputs bit values BL7 to BL1 that are included in the comparison signal CMPO. Each of the bit values BL7 to BL1 may be 0 or 1.

In addition, each time the switch circuit SWC is switched, the control circuit DCL determines whether or not the conversion voltage VDAC is higher than a first threshold according to the comparison signal CMPO.

An input DC offset voltage of the comparator COM is represented by Vos2 shown in FIGS. 4 and 5. When the comparator COM is in an ideal state or has been corrected in step S103, the DC offset voltage Vos2 is 0, which is represented by Vos2=0. A DC offset voltage of the conversion voltage VDAC is represented by Vos1 shown in FIGS. 4 and 5. When the third switch component SW3 is turned off, the DC offset voltage Vos1 is generated in the conversion voltage VDAC. The DC offset voltage Vos1 may be caused by some reasons, such as charges injected to the first comparison input terminal T1 when a channel of the third switch component SW3 is closed, and a parasitic capacitor of the third switch component SW3 coupled to the first comparison input terminal T1.

When the third switch component SW3 is turned on, the conversion voltage VDAC is coupled to the third reference voltage VREF3, which is represented by VDAC=VREF3. Under this condition, the conversion voltage VDAC should be equal to the third reference voltage VREF3 in an ideal state. However, in practice, the conversion voltage VDAC offsets to form an initial conversion voltage VDAC0, which is caused by the above-mentioned reasons. The DC offset voltage Vos2 of the comparator COM causes an increase in a threshold voltage. As shown in FIG. 4, the threshold voltage is represented by Vt1 and calculated by the following equation: Vt1=VREF3+Vos2.

The DC offset voltages Vos1 and Vos2 were analog voltages and difficult to be accurately evaluated, but as shown in FIG. 4, they can be precisely indicated by digital values of by BL[7:1]. The DC offset voltages Vos1 and Vos2 needs to be subtracted in the following procedure. External power noise interference and noise interference of the component itself may result in different values of BL[7:1] even with the same DC offset voltages Vos1 and Vos2. Therefore, by repeating step S105 multiple times, a plurality of digital values of BL[7:1] are obtained and an average value of the digital values of BL[7:1] is calculated, thereby greatly improving an accuracy.

In detail, as shown in FIG. 4, the conversion voltage VDAC is lower than the threshold voltage Vt1 such that the digital value of the comparison signal CMPO is 0 at a time point t0. This result is recorded as WRES=0. The control circuit DCL switches the first switch component SW17 to the second reference voltage VREF2 at the high voltage level at a time point t1, which is represented by BL[7]=1. As a result, the first capacitor C17 that has a largest capacitance among the first capacitors C11 to C17 is coupled to the second reference voltage VREF2 at the high voltage level through the first switch component SW17.

After the first switch component SW17 is switched to the second reference voltage VREF2 at the high voltage level, the control circuit DCL determines that the conversion voltage VDAC is higher than the threshold voltage Vt1 and accordingly switches the first switch component SW17 back to the first reference voltage VREF1 at the low voltage level, which is represented by BL[7]=0.

Then, as shown in FIG. 4, the control circuit DCL switches the first switch component SW16 to the second reference voltage VREF2 at the high voltage level at a time point t2, which is represented by BL[6]=1. As a result, the first capacitor C16 that has a second largest capacitance among the first capacitors C11 to C17 is coupled to the second reference voltage VREF2 at the high voltage level through the first switch component SW16, which is represented by BL[6]=1.

The first switch component SW16 is switched to the second reference voltage VREF2 at the high voltage level until the conversion voltage VDAC is higher than the threshold voltage Vt1. When the control circuit DCL determines that the conversion voltage VDAC is higher than the threshold voltage Vt1, the control circuit DCL switches the first switch component SW16 back to the first reference voltage VREF1 at the low voltage level, which is represented by BL[6]=0.

Then, as shown in FIG. 4, the control circuit DCL switches the first switch component SW15 to the second reference voltage VREF2 at the high voltage level at a time point t3, which is represented by BL[5]=1. As a result, the first capacitor C15 is coupled to the second reference voltage VREF2 through the first switch component SW15.

After the first switch component SW15 is switched to the second reference voltage VREF2 at the high voltage level, the control circuit DCL determines that the conversion voltage VDAC is lower than the threshold voltage Vt1. Accordingly, the first switch component SW15 is continually coupled to the second reference voltage VREF2 at the high voltage level.

Then, the control circuit DCL sequentially switches the first switch component SW14 to SW11 in the same way to determine BL[4] to BL[1]. When each of the first switch component SW17 to SW11 is being switched, all of the second switch components SW21 to SW27 are switched to the first reference voltage VREF1 at the low voltage level, which is represented by BM[7:1]=0. As a result, a final conversion voltage VDAC1 is approximate to an actual conversion level of the comparator COM that is the threshold voltage Vt1 and higher than the initial conversion voltage VDAC0.

As shown in FIG. 4, when the final conversion voltage VDAC1 is higher than the initial conversion voltage VDAC0, WRES=0 and the digital values of BL[7:1] obtained finally represent a positive DC offset value of the final conversion voltage VDAC1.

The same descriptions of FIGS. 4 and 5 are not repeated here, but differences between them are described as follows. When the third switch component SW3 is turned off, the conversion voltage VDAC shown in FIG. 5 offsets a positive voltage. The conversion voltage VDAC increases the offset voltage Vos1 to form the initial conversion voltage VDAC0. The initial conversion voltage VDAC0 is higher than an actual conversion voltage of the comparator COM, which is equal to a voltage obtained by subtracting the DC offset voltage Vos2 from the third reference voltage VREF3. As a result, CMPO=1. This result is recorded by WRES=1. Then, subsequent processes are performed during a second sampling phase time.

First, as shown in FIG. 5, all of the first switch components SW11 to SW17 are switched to the second reference voltage VREF2 at the high level, which is represented by BL[1]=1, BL[2]=1, BL[3]=1, BL[4]=1, BL[5]=1, BL[6]=1, BL[7]=1, during the second sampling phase.

Then, as shown in FIG. 5, the control circuit DCL sequentially switches the first switch components SW17 to SW11 to the first reference voltage VREF1 at the low level from the second reference voltage VREF2 at the high level, during a second converting phase.

Each time the switch circuit SWC is switched, the control circuit DCL determines whether or not the conversion voltage VDAC is higher than a threshold voltage Vt2 according to the comparison signal CMPO.

If the conversion voltage VDAC is lower than the threshold voltage Vt2, the control circuit DCL switches the first switch components SW11 to SW17 to be coupled to the second reference voltage VREF2 at the high level. If the conversion voltage VDAC is higher than the threshold voltage Vt2, the control circuit DCL still switches the first switch components SW11 to SW17 to the first reference voltage VREF1 at the low level.

As shown in FIG. 5, when the final conversion voltage VDAC1 is lower than the initial conversion voltage VDAC0, WRES=1, and the digital values of BL[7:1] obtained finally needs to be reversed to obtain a negative DC offset value of the final conversion voltage VDAC1. For example, BL[7:1]=1111010 is reversed into BL[7:1] =0000101.

Figure 6:
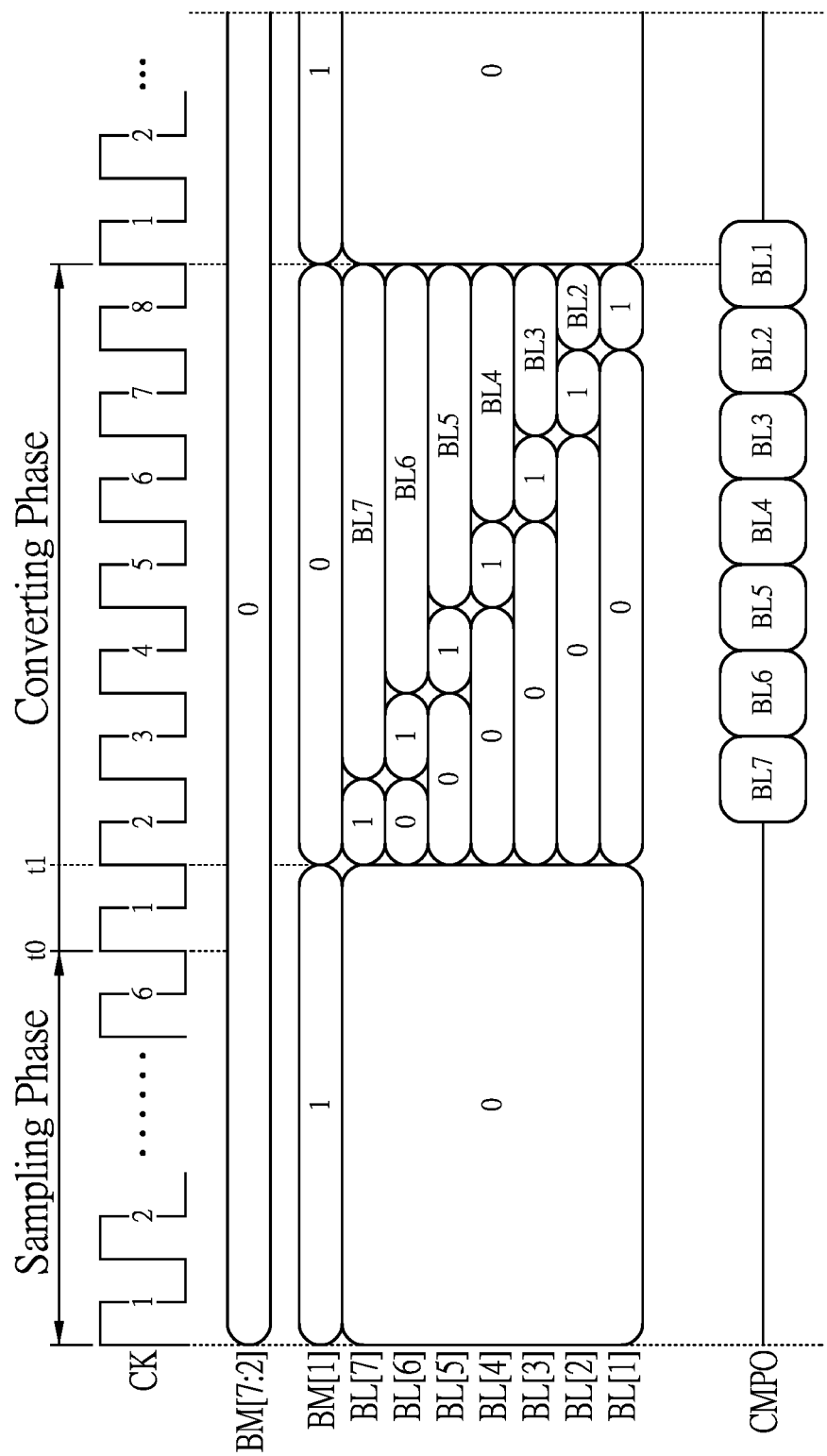
FIG. 6 is a waveform diagram of signals generated when the analog-to-digital conversing system and method with the offset and bit weight correction mechanisms perform a correction process on a second capacitance weight that is the smallest one among a second capacitor group and couple a second capacitor having a smallest capacitance among the second capacitor group and the plurality of first capacitors to different voltage levels according to the embodiment.

As shown in FIG. 6, in step S107, the second capacitance weight that is the smallest one among the second capacitor group is measured. The control circuit DCL controls the second switch component SW21 to be coupled to the second reference voltage VREF2, which is represented by BM[1] =1, during a sampling phase time. Then, before the digital values of BL[7:1] change, the control circuit DCL must switch the second switch component SW21 to the first reference voltage VREF1, which is represented by BM[1] =0, at a time point such as t0 or t1 within a converting phase time.

Figure 7:
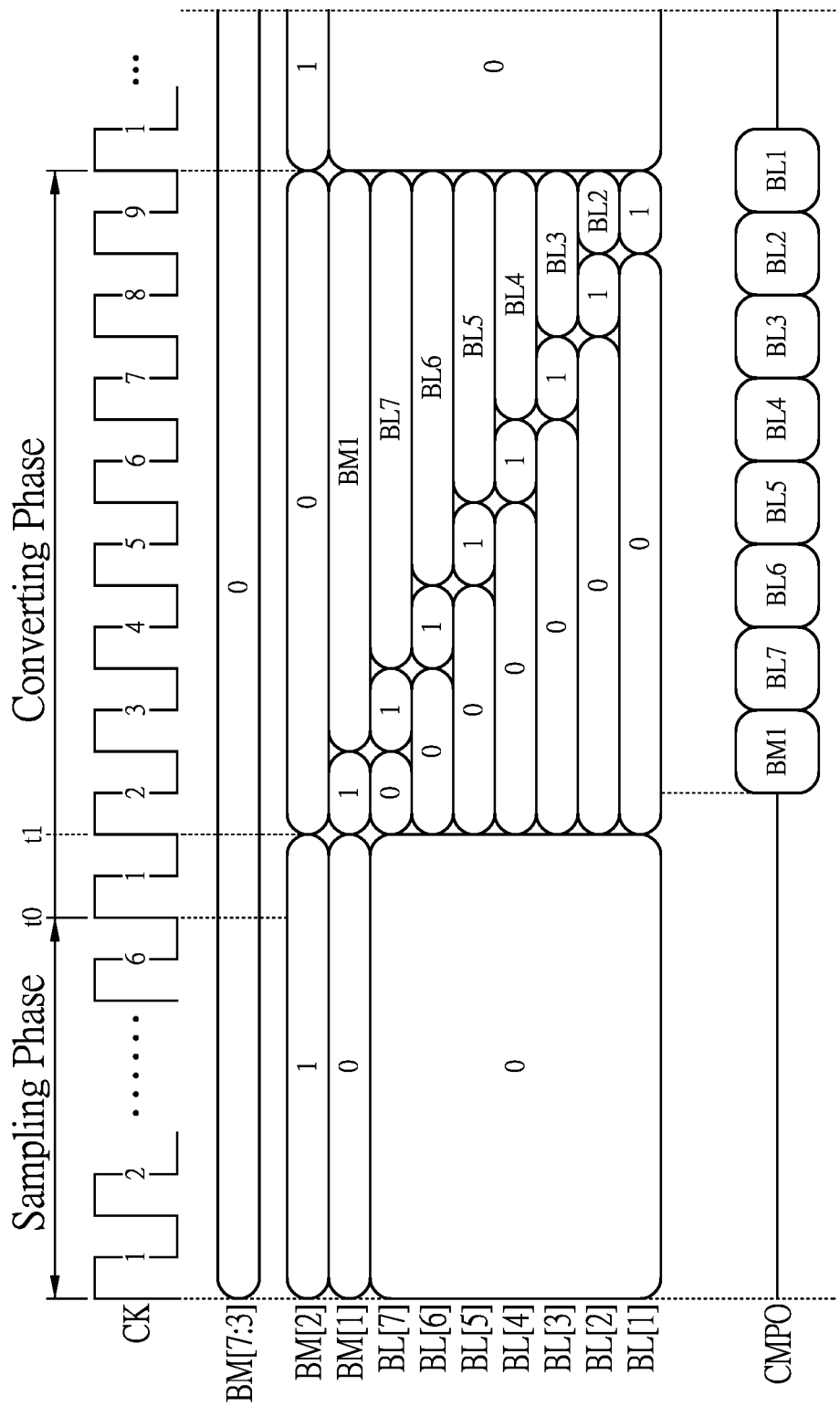
FIG. 7 is a waveform diagram of signals generated when the analog-to-digital conversing system and method with the offset and bit weight correction mechanisms perform a correction process on a second capacitance weight that is the second smallest one among the second capacitor group, and couple the second capacitors that respectively have a smallest and a second-smallest capacitances among the second capacitor group and the plurality of first capacitors to different voltage levels according to the embodiment.

As shown in FIG. 7, in step S107, the second capacitance weight that is the second smallest one among the second capacitor group is measured. The control circuit DCL controls the second switch component SW22 to be coupled to the second reference voltage VREF2, which is represented by BM[2]=1, during a sampling phase time. Then, before the digital values of BM[1] and BL[7:1] change, the control circuit DCL must switch the second switch component SW21 to be coupled to the first reference voltage VREF1, which is represented by BM[2]=0, at a time point such as t0 or t1 within a converting phase time.

In step S109, the correction parameter of the DC offset of the comparator COM, the DC offset of the conversion voltage VDAC, the first capacitance weights of the first capacitors C11 to C1n and the second capacitance weights of the second capacitors C21 to C2m are stored in a storage circuit. The storage circuit may be included in the decode circuit TSR shown in FIG. 1. For example, the storage circuit may be a memory or other components each having a storing function.

Figure 3:
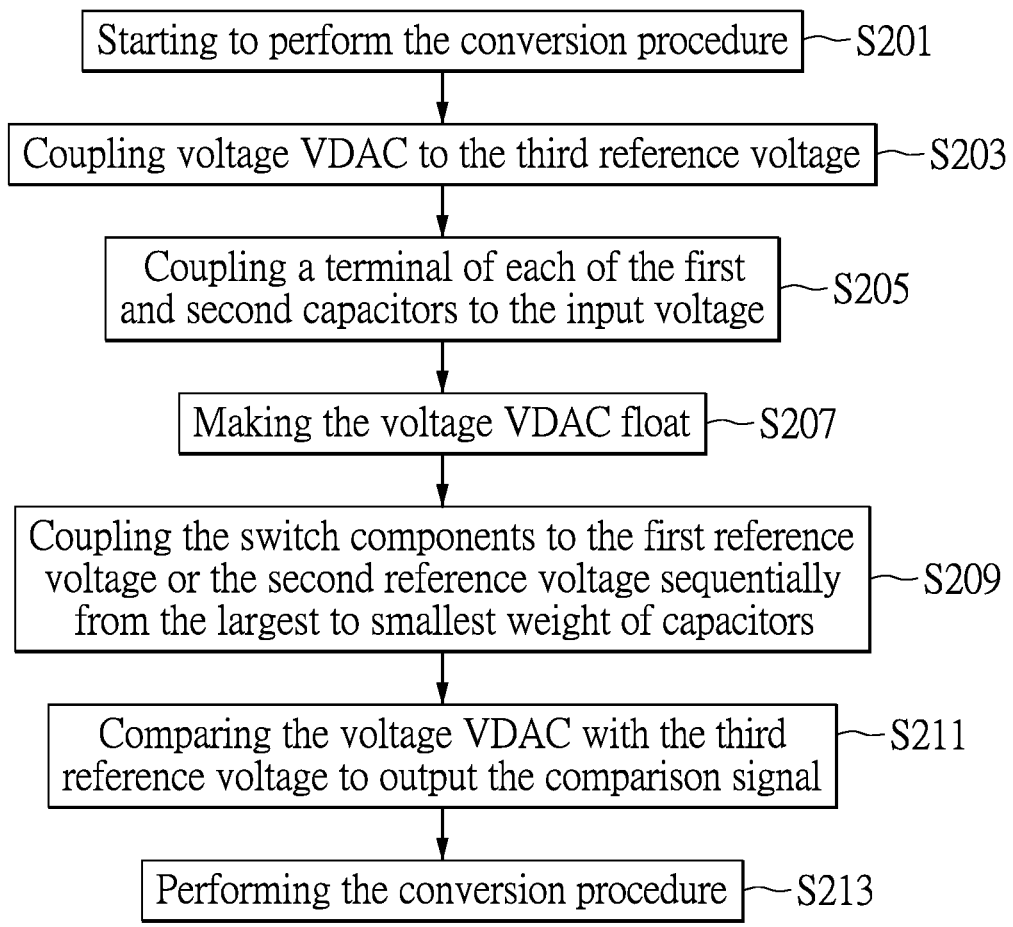
FIG. 3 is a flowchart diagram of steps of converting the analog signal into the digital signal of the analog-to-digital conversion method with the offset and bit weight correction mechanisms according to the embodiment.
Figure 8:
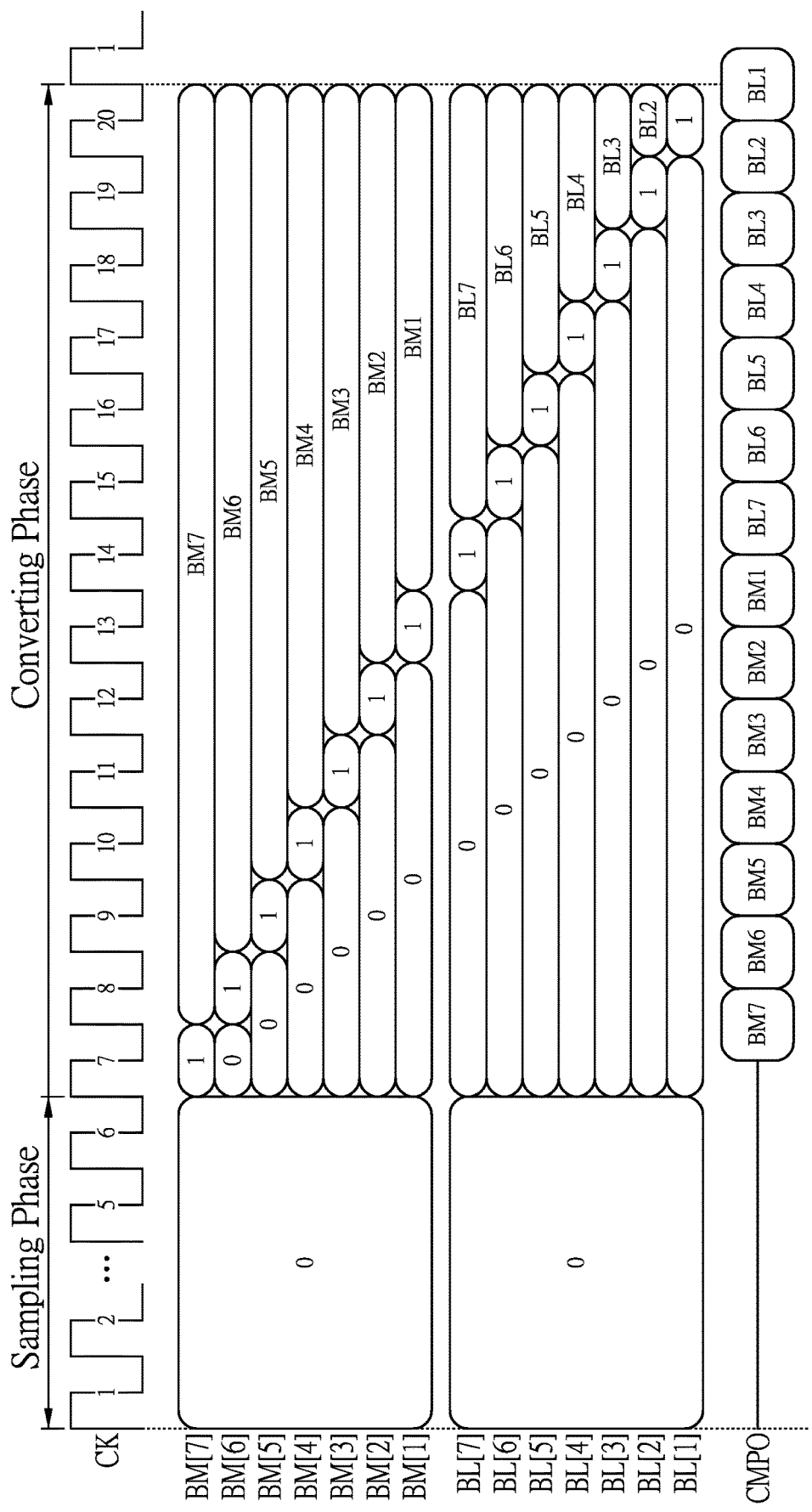
FIG. 8 is a waveform diagram of signals generated when the analog-to-digital converting system and method with the offset and bit weight correction mechanisms convert the analog signal into the digital signal according to the embodiment.

Reference is made to FIGS. 3 and 8, wherein FIG. 3 is a flowchart diagram of steps of converting the analog signal into the digital signal of the analog-to-digital conversion method with the offset and bit weight correction mechanisms according to the embodiment, and FIG. 8 is a waveform diagram of signals generated when the analog-to-digital converting system and method with the offset and bit weight correction mechanisms convert the analog signal into the digital signal according to the embodiment.

In the embodiment, the analog-to-digital conversion method may include steps S201 to S213 shown in FIG. 3 that may be performed after steps S101 to S109 shown in FIG. 2, and is applicable to the analog-to-digital converting system shown in FIG. 1. It should be understood that, an order and processes of the steps S101 to S109 may be adjusted according actual requirements.

In step S201, voltage conversion processes are started to be performed.

In step S203, the control circuit DCL turns on the third switch component SW3 such that the first comparison input terminal T1 of the comparator COM is coupled to the third reference voltage VREF3 through the third switch component SW3. As a result, the conversion voltage VDAC is equal to the third reference voltage VREF3.

In step S205, the control circuit DCL controls all of the first switch components SW11 to SW1n and all of the second switch components SW21 to SW2m in the switch circuit SWC to be coupled to the input signal VIN. Under this condition, all of the first capacitors C11 to C1n of the first capacitor group LSB and all of the second capacitors C21 to C2m of the second capacitor MSB are charged by the input signal VIN.

In step S207, the control circuit DCL turns off the third switch component SW3 such that the first comparison input terminal T1 of the comparator COM is decoupled from the third reference voltage VREF3. As a result, the conversion voltage VDAC is floating.

In step S209, the control circuit DCL switches the first switch components SW11 to SW1n and the second switch components SW21 to SW2m as shown in FIG. 1.

For example, as shown in FIG. 8, the control circuit DCL sequentially switches the second switch components SW21 to SW2m and the first switch components SW11 to SW1n to the second reference voltage VREF2 (at a voltage level of 1) from the first reference voltage VREF1 (at a voltage level of 0), in an order of the second capacitance weights of the second capacitors C27 to C21 and the first capacitance weights of the first capacitors C17 to C11 from large to small.

In step S211, after each of the first switch components SW11 to SW1n and the second switch components SW21 to SW2m is switched, the comparator COM compares the conversion voltage VDAC shown in FIG. 1 with the third reference voltage VREF3 to output the comparison signal CMPO. The comparison signal CMPO represents bit values BM1 to BM7 and BL1 to BL7, each of which may be 0 or 1 as shown in FIG. 8.

In step S213, the control circuit DCL shown in FIG. 1 outputs the digital signal Dout1 having K bits to the decode circuit TSR according to the comparison signal CMPO. The decode circuit TSR performs an offset correction process on the digital signal Dout1. If WRES=0, the digital value of BL[7:1] obtained in step S105 is subtracted from the digital signal Dout1. If WRES=1, the digital signal Dout1 is summed up with the digital value of BL[7:1] obtained in step S105. Then, each of the bit values of the digital signal Dout1 is multiplied by the corresponding first or second capacitance weight, and then is converted into the decode signal Dout2 having N binary bits, which is more specifically described as follows. The first capacitance weight that is the smallest one among the first capacitor group LSB corresponds to a bit weight of the digital value that is the smallest one among the digital signal Dout1. The first capacitance weight that is the second smallest one among the first capacitor group LSB corresponds to a bit weight of the digital value that is the second smallest one among the digital signal Dout1. The second capacitance weight that is the largest one among the second capacitor group MSB corresponds to a bit weight of the digital value that is the largest one among the digital signal Dout1. That is, the first and second capacitance weights from small to large respectively correspond to the bit weights of the digital signal Dout1 from small to large.

That is, the present disclosure provides the analog-to-digital conversion method with the offset and bit weight correction mechanisms. The analog-to-digital conversion method includes the following steps: converting a direct current offset of the digital-analog converter into the digital signal multiple times based on each of the first capacitance weights in the first capacitor group, averaging the plurality of digital signals to obtain a final digital value that represents the direct current offset voltage of the digital-analog converter, wherein the final digital value is a positive or negative value; converting the second capacitance weight that is the smallest one among the second capacitor group into the digital signal multiple times based on each of the first capacitance weights in the first capacitor group, averaging the plurality of digital signals to obtain a first averaged digital signal, subtracting the direct current offset digital value of the digital-analog converter from the first averaged digital signal to obtain a final digital value that represents the second capacitance weight that is the smallest second capacitance weight; converting the second capacitance weight that is the second smallest one among the second capacitor group into the digital signal multiple times based on the final smallest second capacitance weight and each of the first capacitance weights in the first capacitor group, averaging the plurality of digital signals to obtain a second averaged digital signal, subtracting the direct current offset digital value of the digital-analog converter from the second averaged digital signal to obtain a final digital value that represents the second capacitance weight that is the second-smallest second capacitance weight; converting the second capacitance weight that is the third smallest one among the second capacitor group into the digital signal multiple times based on the final second-smallest second capacitance weight, the final smallest second capacitance weight and each of the first capacitance weights in the first capacitor group, averaging the plurality of digital signals to obtain a third averaged digital signal, subtracting the direct current offset digital value of the digital-analog converter from the third averaged digital signal to obtain a final digital value that represents the third-smallest second capacitance weight; sequentially obtaining final second capacitance weights of others of the second capacitors in the similar manner.

The analog-to-digital conversion method with the offset and bit weight correction mechanisms may further include the following steps: inputting an analog signal and converting the analog signal in to the digital signal; subtracting the direct current offset digital value of the digital-analog converter from the digital signal to obtain a final input signal digital value; and multiplying each of bit values of the final input signal digital value by a bit weight to obtain a product value and converting a sum of the product values into a binary digital value.

In summary, the present disclosure provides the analog-to-digital converting system and method with the offset and bit weight correction mechanisms, which have at least the following beneficial effects.

With redundant conversion cycle and special weight configurations, requirements for a bandwidth and a setting time of a reference voltage driver circuit can be relaxed, such that the analog-to-digital converting system can convert a voltage at a higher conversion rate;

The present disclosure uses a capacitive digital-to-analog converter (CDAC), in which the capacitance of each of the capacitors of is an integer multiple of the unit capacitance that is the smallest one among all of the capacitances. Therefore, the present disclosure has a good circuit layout.

The present disclosure uses a split capacitive digital-to-analog converter (Split-CDAC). A size of the second capacitor group (MSB) in the split capacitive digital-to-analog converter is smaller than that of a conventional binary capacitive digital-to-analog converter.

The same analog hardware is used for conversion and calibration, without additional hardware for calibration. Therefore, an occupied area of the analog hardware can be reduced and the analog hardware can be integrated with other functional circuits into a single chip.

The DC offset of the digital-analog converter can be recorded by a digital value. The DC offset can be subtracted in the subsequent conversion processes of the bit weights, and the analog-to-digital conversion process. Therefore, bit weights and the conversion voltage can be obtained accurately.

An attenuation error of the capacitive digital-to-analog converter can be minimized such that a linearity of the output voltage can be improved by performing estimation processes of the bit weights.

The digital values are obtained multiple times and the average value of the digital values is calculated, thereby prevent noise from affecting the digital value obtained finally.

The conversion of the offset, the bit weights and the input signal are performed by the same progressive register (SAR) without performing other correction algorithms.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An analog-to-digital converting system with offset and bit weight correction mechanisms, comprising:
   a capacitor circuit including a first capacitor group, a second capacitor group and a bridge capacitor, wherein the first capacitor group is coupled with the second capacitor group through the bridge capacitor, the first capacitor group includes a plurality of first capacitors, the second capacitor group includes a plurality of second capacitors, an actual capacitance of each of the first capacitors is defined as a first capacitance weight, each one of the first capacitance weights is not larger than a sum of the first capacitance weights each being smaller than the one first capacitance weight, a sum of all of the first capacitance weights is divided by an actual capacitance of the bridge capacitor to obtain an attenuation coefficient that is larger than 1, an actual capacitance of each of the second capacitors is multiplied by the attenuation coefficient to obtain a second capacitance weight, the second capacitance weight that is the smallest one among the second capacitor group is not larger than the sum of all of the first capacitance weights of the first capacitor group, each one of the second capacitance weights is not larger than a sum of the smaller second capacitance weights each being smaller than the one second capacitance weight, each of capacitances of the capacitor circuit is an integer multiple of the capacitance that is the smallest one among the capacitances of the capacitor circuit, the capacitor circuit is taken as a digital-analog converter unit in an analog-digital converter system, a digital-analog converted voltage is at a node at which the second capacitor group is coupled with the bridge capacitor;

a comparator having a first comparison input terminal connected to a node between the second capacitor group and the bridge capacitor, and having a second comparison input terminal coupled to a third reference voltage, wherein the comparator is configured to compare the third reference voltage with a converted voltage of the digital-analog converter to output a comparison signal;

a switch circuit including a plurality of first switch components, a plurality of second switch components, and a third switch component, wherein the first switch components are connected to the first capacitors respectively, the second switch components are connected to the second capacitors respectively, each of the first switch components and the second switch components are switched between an input signal, a first reference voltage and a second reference voltage, and the first comparison input terminal of the comparator is coupled to the third reference voltage through the third switch component being turned on;

a control circuit connected to the switch circuit and the comparator, and configured to output a digital signal according to the comparison signal and output a control signal for controlling the switch circuit; and a decode circuit connected to the control circuit and configured to decode the digital signal to output a decode signal having one or more bit values.

2. The analog-to-digital converting system according to claim 1, further comprising:

a storage circuit configured to record a correction parameter of an input offset of the comparator, a direct current offset of the digital-analog converter, the first capacitance weights and the second capacitance weights.

* * * * *